US007163779B2

(12) United States Patent
Hiraoka

(10) Patent No.: US 7,163,779 B2
(45) Date of Patent: Jan. 16, 2007

(54) PLANOGRAPHIC PRINTING PLATE MATERIAL PROCESS, PLANOGRAPHIC PRINTING PLATE AND PRINTING PROCESS

(75) Inventor: Saburou Hiraoka, Machida (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/001,942

(22) Filed: Dec. 2, 2004

(65) Prior Publication Data

US 2005/0130065 A1 Jun. 16, 2005

(30) Foreign Application Priority Data

Dec. 12, 2003 (JP) ............................ 2003-414435

(51) Int. Cl.
*G03F 7/26* (2006.01)

(52) U.S. Cl. ................ 430/302; 430/281.1; 430/284.1; 430/309; 430/435; 430/494

(58) Field of Classification Search ................ 430/138, 430/270.1, 271.1, 281.1, 302, 309, 434, 435, 430/448, 494, 284.1; 101/453, 463.1, 465
See application file for complete search history.

(56) References Cited

U.S. PATENT DOCUMENTS 6,197,847 B1 * 3/2001 Kato et al. .................. 523/160
6,387,595 B1 * 5/2002 Teng .......................... 430/302
6,482,571 B1 11/2002 Teng
6,489,375 B1 * 12/2002 Stone et al. .................. 522/84
6,796,236 B1 * 9/2004 Mori .......................... 101/460
6,840,175 B1 * 1/2005 Battersby et al. ........... 101/451
2002/0009574 A1 1/2002 Hiraoka

FOREIGN PATENT DOCUMENTS

EP 0 770 494 A2 5/1997
EP 04 10 6244 3/2005

* cited by examiner

*Primary Examiner*—Barbara L. Gilliam
(74) *Attorney, Agent, or Firm*—Lucas & Mercanti, LLP

(57) ABSTRACT

Disclosed is a process of manufacturing a planographic printing plate from a planographic printing plate material comprising a support and provided thereon, at least one of an image formation layer and an ablation layer, the process comprising the steps of imagewise exposing the planographic printing plate material, and developing the exposed planographic printing plate material by supplying printing ink containing at least one of a polymerizable monomer and a polymerizable oligomer to the exposed planographic printing plate material.

8 Claims, No Drawings

PLANOGRAPHIC PRINTING PLATE MATERIAL PROCESS, PLANOGRAPHIC PRINTING PLATE AND PRINTING PROCESS

FIELD OF THE INVENTION

The present invention relates to a process of manufacturing a planographic printing plate from a processless planographic printing plate material, a planographic printing plate, and printing process.

BACKGROUND OF THE INVENTION

In recent years, a material for a computer to plate system (CTP), in which image data can be directly recorded in a planographic printing plate material without employing an original, has been sought accompanied with the digitization of printing data.

In recent years, a material for a computer to plate system (CTP), in which image data can be directly recorded in a planographic printing plate material without employing an original, has been sought accompanied with the digitization of printing data. Further, a processless CTP system is widely spreading which is capable of being developed only by exposure (on-press development is included), and does not require development by an alkali developer nor an automatic developing machine, in view of space saving and environmental requirement.

In a plate making of a processless CTP, a planographic printing plate material is imagewise exposed, mounted on a plate cylinder of a printing press, and developed with printing ink alone or with printing ink and a dampening solution where unnecessary portions of the exposed planographic printing plate material are removed.

There are, for example, a processless CTP comprising an image formation layer containing heat fusible particles and a water-soluble binder in which the image formation layer at unexposed portions are removed with printing ink and/or a dampening solution (see JP 2938839, and Japanese Patent O.P.I. Publication Nos. 9-123387, 2001-96710, 2001-334766, 2002-361996, 2002-178665, and 2001-33476), and a processless CTP in which the outermost layer is broken by ablation, and the broken portions are removed to reveal a layer different in ink affinity from the outermost layer (see Japanese Patent O.P.I. Publication Nos. 7-164773). These processless CTP has advantages in that plate making is carried out in a short time. However, recently, further shorter plate making time is required, since many kinds of prints in a small number are demanded.

As a method of shortening on-development time (development on a plate cylinder) has been disclosed in Japanese Patent O.P.I. Publication Nos. 2000-52634, 9-123387, and 9-123388, in which when developing the processless CTP on a plate cylinder, optimum timing of supply of a dampening solution and printing ink to the CTP is disclosed. However, the above methods have problems in that time taken to supply a dampening solution and printing ink at initial printing stage is not so short, and stain remains at non-image portions of prints printed at initial printing stage.

SUMMARY OF THE INVENTION

The present invention has been made in view of the above. An object of the invention is to provide a planographic printing plate manufacturing process, shortening developing time of a planographic printing plate material mounted on a plate cylinder of a printing press in a processless CTP system, providing no stains at non-image portions at initial printing stage and no image faults, and reducing paper wastes; and a planographic printing plate manufactured by the process; and a printing process employing the planographic printing plate.

DETAILED DESCRIPTION OF THE INVENTION

The present inventor has made an extensive study on a method capable of rapidly developing a planographic printing plate material on the plate cylinder. As a result, he has found that a component of the printing ink plays a significant role in removing portions unnecessary for printing of the planographic printing plate material, and completed this invention.

The above object has been attained by one of the following constitutions.

1. A process of manufacturing a planographic printing plate from a planographic printing plate material comprising a support and provided thereon, at least one of an image formation layer and an ablation layer, the process comprising the steps of imagewise exposing the planographic printing plate material, and developing the exposed planographic printing plate material by supplying printing ink containing at least one of a polymerizable monomer and a polymerizable oligomer to the exposed planographic printing plate material.

2. The process of item 1 above, wherein the content of the at least one of the polymerizable monomer and the polymerizable oligomer in the printing ink is 10 to 40% by weight.

3. The process of item 1 above, wherein the at least one of the polymerizable monomer and the polymerizable oligomer is selected from the group consisting of (meth)acrylic acid, maleic acid, and their oligomer; and urethane resin, epoxy resin, polyester resin, polyol resin, rosin resin, and vegetable oil, each being modified with a compound having an ethylenically unsaturated bond.

4. The process of item 3 above, wherein the at least one of the polymerizable monomer and the polymerizable oligomer is vegetable oil modified with a compound having an ethylenically unsaturated bond.

5. The process of item 1 above, wherein the support is a hydrophilic support.

6. The process of item 1 above, wherein the image formation layer contains heat fusible particles, hydrophobic precursor particles or microcapsules.

7. The process of item 1 above, wherein the printing ink further contains vegetable oil.

8. The process of item 7 above, wherein the vegetable oil is soybean oil.

9. A printing process comprising the steps of supplying printing ink containing a polymerizable monomer or a polymerizable oligomer to a planographic printing plate manufactured according to the process of item 1 above to form an ink image on the printing plate, and transferring the formed ink image onto a recording sheet to obtain a print.

1-1. A process of manufacturing a planographic printing plate from a planographic printing plate material, the process comprising the steps of imagewise exposing the planographic printing plate material, and developing the exposed planographic printing plate material by supplying printing ink containing a polymerizable monomer or a polymerizable oligomer to the exposed planographic printing plate material.

1-2. The process of item 11 above, wherein the planographic printing plate material comprises a hydrophilic support, and provided thereon, an image formation layer containing heat fusible particles, hydrophobic precursor particles or microcapsules.

1-3. The process of item 1-1 or 1-2 above, wherein the printing ink further contains vegetable oil.

1-4. A printing process comprising the steps of supplying printing ink containing a polymerizable monomer or a polymerizable oligomer to a planographic printing plate manufactured according to the process of any one of items 1-1 through 1-3 above to form an ink image on the printing plate, and transferring the ink image onto a recording sheet to obtain a print.

1-5. A planographic printing plate, wherein the planographic printing plate is manufactured according to a process comprising the steps of imagewise exposing a planographic printing plate material, and developing the exposed planographic printing plate material by supplying printing ink containing a polymerizable monomer or a polymerizable oligomer to the exposed material.

The preferred embodiment of the invention will be explained below, but the invention is not limited thereto.

<Printing Ink>

(Polymerizable Monomer, Polymerizable Oligomer)

In the invention, the printing ink preferably contains a polymerizable monomer and/or a polymerizable oligomer. Herein, the polymerizable monomer has an ethylenically unsaturated bond, and a weight average molecular weight of less than 3,000, and the polymerizable oligomer has an ethylenically unsaturated bond, and a weight average molecular weight of not less than 3,000. Examples thereof include (meth)acrylic acid, maleic acid, and their derivative; and urethane resin, epoxy resin, polyester resin, polyol resin, rosin resin, and vegetable oil, each being modified with a compound having an ethylenically unsaturated bond such as (meth)acrylic acid or its derivative. Among them, those, which are miscible with a rosin-modified phenol resin, for example, vegetable oil modified with a compound having an ethylenically unsaturated bond such as (meth)acrylic acid or its derivative, are preferred. These compounds may be used alone or as an admixture of two or more kinds thereof. The content of the polymerizable monomer and/or oligomer in the printing ink in the invention is preferably 10 to 40% by weight.

When printing is carried out employing a planographic printing plate described later, incorporation of the polymerizable monomer and/or the polymerizable oligomer to printing ink reduces paper wastes or image faults at initial printing stage, and further makes it possible to remove easily stains at non-image portions of the printing plate caused by scratches or pressure. This mechanism is not clear, but is probably because the polymerizable monomer and/or the polymerizable oligomer swells a layer at portions unnecessary for printing in an exposed planographic printing plate material, and makes it possible to remove easily the swelled portions due to ink tackiness.

(Vegetable Oil)

In the invention, printing ink preferably contains vegetable oil. Example of the vegetable oil include soybean oil, cotton seed oil, linseed oil, safflower oil, tung oil, tall oil, castor oil, oiticica oil, candlenut oil, akarritom seed fat, parinarium seed fat, dehydrated castor oil, and canola oil. These vegetable oils may be alone or as an admixture of two or more kinds thereof. In the invention, the content of the vegetable oil in the printing ink is preferably from 10 to 40% by weight.

When printing is carried out employing a planographic printing plate described later, incorporation of vegetable oil to printing ink reduces paper wastes at initial printing stage or image faults, and minimizes stains at non-image portions of the printing plate produced by scratches or pressure. This is probably because the vegetable oil enhances a swell property of a layer at portions unnecessary for printing in an exposed planographic printing plate material.

(Other Components of Printing Ink)

The printing ink in the invention can contain pigment for coloring. As the pigment used in the invention, there are known inorganic or organic pigments. Examples of the inorganic pigment include titanium oxide, calcium carbonate, barium sulfate, alumina white, zinc oxide, prussian blue, red iron oxide, carbon black, aluminum powder, and brass powder. Examples of the organic pigment include soluble azo pigments of the β-naphthol, β-oxynaphthoic acid, β-oxynaphthoic acid arylide, acetoacetic acid arylide, and pyrazolone type; insoluble azo pigments of the β-naphthol, β-oxynaphthoic acid arylide, acetoacetic acid arylide monoazo, acetoacetic acid arylide bisoazo, and pyrazolone type; phthalocyanine pigments such as copper phthalocyanine blue, chlorinated or brominated copper phthalocyanine blue, sulfonated copper phthalocyanine blue, and metal free phthalocyanine; and polycyclic or heterocyclic pigments of the quinacridone., dioxazine, pyranthrone, anthanthrone, indanthrone, anthrapyrimidine, fravanthrone, thioindigo, anthraquinone, perynone, perylene, isoindolinone, metal complexes, and quinophtharone type.

As a binder used in printing ink in the invention, resin used in conventional ink for offset printing can be used without any limitations. Examples of such resin include rosin modified phenol resin, rosin modified maleic acid resin, and various alkyd resins, petroleum resin, rosin ester resin, polyester resin, gilsonite and their modified resins. The rosin modified phenol resin can be used alone or in combination with synthetic resins such as various alkyd resins, petroleum resin, rosin ester resin, polyester resin, gilsonite and their modified resins. Various alkyd resins, petroleum resin, etc. can be also used in combination with the rosin modified phenol resin. These binders can be used alone or as a mixture of two or more kinds thereof.

The resins above cross-linked or gelled employing a cross-linking agent or a gelling agent also can be used as a binder for printing ink. Examples of the cross-linking agent include isocyanate compounds such as tolylene diisocyanate, diphenylmethane diisocyanate, isophorone diisocyanate, hexamethylene diisocyanate, tetramethylxylylene diisocyanate, and polymethylenepolyphenyl polyisocyanate. Examples of the gelling agent include aziridine compounds such as trimethylolpropane-tris-β-N-aziridinylpropionnate, and pentaerithritolpropane-tris-β-N-aziridinylpropionnate; epoxy compounds such as glycerol polyglycidyl ether, and trimethylolpropane polyglycidyl ether; and aluminum chelate compounds such as ethylacetate aluminum diisopropoxide. These cross-linking agents or gelling agents can be used alone or as a mixture of two or more kinds thereof, respectively.

The binder is preferably a cross-linked resin which is obtained by heating a mixture of a resin with a hydroxyl group and a polyfunctional isocyanate compound as a cross-linking agent or a mixture of a resin with a hydroxyl group, a polyfunctional isocyanate compound as a cross-linking agent and a catalyst. That is, the cross-linked resin is preferably used which is obtained by heating and reacting a resin with a hydroxyl group, a polyfunctional isocyanate compound as a cross-linking agent, and optionally a catalyst. The resin with a hydroxyl group and the polyfunctional isocyanate is appropriately selected from those described above. As the catalyst can be used conventional ones such as organic titanate compounds, organic tin compounds, and organic amines. Typical examples thereof include tetrabutyl titanate, stannous octilate, dibutyltin acetate, triethylamine, dimethylaniline, and triethylenediamine. These catalysts can be used alone or as an admixture of two or more kinds thereof. The heating condition is not specifically limited as long as it is such condition under which the resin with a hydroxyl group is cross-linked through the cross-linking agent.

The printing ink of the invention can contain a photopolymerization initiator. As the photopolymerization initiator, conventional ones can be used, but one which can absorb ultraviolet light to generate an active radical is preferred. Examples thereof include acetophenone, 2,2-diethoxyacetophenone, p-dimethylaminoacetophenone, benzophenone, 2-chlorobenzophenone, p,p'-dichloro-benzophenone, p,p'-bisdiethylaminobenzophenone, Michler's ketone, benzil, dibenzoyl, benzoin methyl ether, benzoin ethyl ether, benzoin propyl ether, benzoin n-propyl ether, benzoin isobutyl ether, benzoin n-butyl ether, benzoin dimethyl ketal, tetramethylthiuram monosulfide, thioxanthone, 2-chlorothioxanthone, 2-methylthioxanthone, azobisisobutyro-nitrile, benzoin peroxide, and di-tert-butyl peroxide. These catalysts may be optionally used as an admixture of two or more kinds thereof.

The printing ink of the invention can contain an oxidation polymerization catalyst. As the oxidation polymerization catalyst, conventional ones can be used. Typical examples thereof include a metal salt of an organic carboxylic acid, for example, a salt of an organic carboxylic acid such as acetic acid, propionic acid, butyric acid, isopentanoic acid, hexanoic acid, 2-ethylbutyric acid, naththenic acid, octylic acid, nonanoic acid, decanoic acid, 2-ethylhexanoic acid, isooctanoic acid, isononanoic acid, lauric acid, palmitic acid, stearic acid, oleic acid, linoleic acid, neodecanoic acid, versatic acid, secanoic acid, linseed oil fatty acid, tall oil fatty acid, dimethylhexanoic acid, 3,5,5-trimethylhexanoic acid, or dimethyloctanoic acid with cobalt, manganese, lead, iron, zinc, calcium, or zirconium; a phenanthroline compound such as 1,10-phenanthroline or 5-methylphenanthrolone; and 2,2'-dipyridine, but the invention is not limited thereto. These compounds can be optionally used as an admixture of two or more kinds thereof.

The ink composition in the invention for offset printing optionally contains an additive such as a polymerization inhibitor, a pigment dispersant, a drying retarder, a solvent, an anti-oxidant, a cleaning auxiliary, an anti-abrasion agent, an anti-offset agent, or a nonionic surfactant.

<Planographic Printing Plate Material>

Next, the planographic printing plate material used in the invention will be explained.

The planographic printing plate material used in the invention may be any as long as it is mounted on a plate cylinder of a printing press and is capable of being developed with printing ink supplied to the material. (Planographic printing plate material [1] comprising a hydrophilic support, and provided thereon, an image formation layer containing heat fusible particles, hydrophobic precursor particles or microcapsules).

This type planographic printing plate material, after iluagewise exposed, can be developed with printing ink or with printing ink and a dampening solution. The heat fusible particles, hydrophobic precursor particles or microcapsules of the image formation layer after exposed are heat-fused or modified at exposed portions to form oleophilic image portions, and remain particles at unexposeci portions to form nonimage portions. A layer unnecessary for printing (a layer at nonexposed portions containing heat fusible particles, hydrophobic precursor particles or microcapsules) can be easily removed by printing ink in the invention, resulting in the effects of the invention.

The hydrophilic support used in this type planographic printing plate material, there is an aluminum plate, which is subjected to mechanically and/or electrolytically surface roughened, and then to anodizing treatment, so called grained support.

Material for aluminum used is preferably 1050 or 1100 series, and more preferably 1050 series. Typical examples thereof include 1050 and 1052. Refining of aluminum is preferably H16 or H18, and preferably H16.

The aluminum plate is electrolytically surface-roughened in a conventional electrolytic apparatus. An electrolytic solution used is preferably a hydrochloric acid solution of or a solution containing as a main component hydrochloric acid. The concentration of hydrochloric acid in the solution is preferably from 0.5 to 5% by weight. The solution optionally contains additives, for example, acids such as acetic acid, oxalic acid, boric acid, and malic acid; and salts such as nitrates, and chlorides. The additive content of the solution is preferably not more than 20% by weight, and more preferably not more than 10% by weight based on the hydrochloric acid content. The electrolytically surface roughening is carried out at a temperature of preferably from 15 to 50° C., and more preferably from 25 to 45° C., for preferably from 5 to 100 seconds, and more preferably from 10 to 60 seconds.

The electrolytically surface-roughened aluminum plate is subjected to desmut treatment. As a solution for the desmut treatment, there is an alkaline solution such as a sodium hydroxide solution or a potassium hydroxide solution, or an acid solution such as a nitric acid solution or a phosphoric acid solution. A sodium hydroxide solution or a potassium hydroxide solution is preferred. The desmut treatment is carried out at a temperature of preferably from 40 to 90° C., and more preferably from 50 to 80° C., for preferably from 10 to 100 seconds, and more preferably from 20 to 80 seconds.

The desmut aluminum plate is subjected to anodizing treatment according to a conventional method. A solution for the anodizing treatment is a sulfuric acid solution or a phosphoric acid solution, and preferably a sulfuric acid solution. The concentration of sulfuric acid or phosphoric acid is from 10 to 50%. A current density used is preferably from 1 to 10 $A/dm^2$. The anodizing treatment is carried out at a temperature of preferably from 20 to 60° C., and more preferably from 30 to 50° C., for preferably from 10 to 180 seconds, and more preferably from 20 to 100 seconds. It is also possible to use a method of applying a high current density in a sulfuric acid solution as described in U.S. Pat. No. 1,412,768.

The aluminum support which has been subjected to anodizing treatment is optionally subjected to sealing treatment. For the sealing treatment, it is possible to use known methods using hot water, boiling water, steam, a sodium silicate solution, an aqueous dichromate solution, a nitrite solution and an ammonium acetate solution.

After the anodizing treatment or the sealing treatment, a hydrophilic layer may be provided on the resulting aluminum support. As the hydrophilic layer can be used an alkali metal silicate layer disclosed in U.S. Pat. No. 3,181,461, a hydrophilic cellulose layer disclosed in U.S. Pat. No. 1,860, 426, a layer of an amino acid or its salt disclosed in Japanese Patent Nos. 6-94234 and 6-2436, a layer of an amino acid with a hydroxyl group or its salt disclosed in Japanese Patent No. 5-32238, a phosphate layer disclosed in Japanese Patent O.P.I. Publication No. 62-19494, and a layer of a polymer with a sulfo group disclosed in Japanese Patent O.P.I. Publication No. 59-101651. A hydrophilic layer may be formed by sub-coating or post-treating the support employing a silane compound as disclosed in Japanese Patent O.P.I. Publication Nos. 59-192250, 6-3810 and 7-15993.

As another hydrophilic support, there is a hydrophilic support in which a hydrophilic layer is provided on a plastic sheet.

As the hydrophilic layer, there is a layer containing a hydrophilic resin or self film-forming particles, and inorganic particles. Examples of the hydrophilic resin used include polyvinyl alcohol, acryl polymers, polyurethanes, and cellulose derivatives. The polyvinyl alcohol has a saponification degree of not less than 95%. The polyvinyl alcohol may be modified with a carboxyl group. Examples of the acryl polymers used include a polymer having a high content of a monomer unit having a high hydrophilic property. Examples of the monomer having a high hydrophilic property include acrylamide, methylolacrylamide, methylolmethacrylamide, acrylic acid, methacrylic acid, hydroxyethyl acrylate, hydroxyethyl methacrylate, a monomer having an ammonium or phosphonium group, and a monomer having a sulfonic acid group, a phosphonic acid group or a phosphate group. Polymer salts can be used which is obtained by neutralizing the above polymers having an acidic group with an alkali. Examples of the polyurethanes used include those having in the side chain a hydrophilic group such as a carboxyl group, a phosphate group, a sulfonic acid group, an amino group or their salt group, a hydroxyl group, an amido group or a polyoxyethylene group. Examples of the cellulose derivatives used include hydroxyethylcellulose, carboxymethylcellulose, hydroxypropylmethylcellulose, and hydroxypropylcellulose.

Examples of the film-forming particles include alumina sol or colloidal silica particles. Colloidal silica particles with a particle size of not more than 50 nm are preferred in that strength or hydrophilicity of the hydrophilic layer is increased. Typically, "Snowtex" series, produced by Nissan Kagaku Kogyo Co., Ltd., can be used. In order to provide a proper layer strength or water retention property of the hydrophilic layer, necklace-shaped colloidal silica particles can be used. The necklace-shaped colloidal silica particles used in the invention refer to a general term of an aqueous dispersion containing spherical silica particles with a primary order particle diameter in "nm" order. Examples of the necklace-shaped colloidal silica particles include Snowtex PS series produced by Nissan Kagaku Kogyo Co., Ltd. The alkaline products of the series include Snowtex PS-S (an average particle diameter of 110 nm in a combined form), Snowtex PS-M (an average particle diameter of 120 nm in a combined form), and Snowtex PS-L (an average particle diameter of 170 nm in a combined form). The corresponding acidic products are Snowtex PS-S-O, Snowtex PS-M-O, and Snowtex PS-L-O, respectively. The self film-forming particles herein refers to those in which when the particles are coated on a base to form a film of a dry thickness of 1.0 μm, and dried at 100° C. for 3 minutes, the film, after rubbed with a sponge, causes no defects on the surface.

The hydrophilic resin and the self film-forming particles may be used in combination.

The inorganic particles usable for the hydrophilic layer include calcium carbonate, barium sulfate, silica, titanium oxide, clay, and alumina. Silica, alumina, titanium oxide and zinc oxide are preferred in that in the hydrophilic layer, mechanical strength, hydrophilicity and water retention are increased, and desensitizing treatment is effectively carried out. The average particle size of the inorganic particles is preferably from 0.01 to 10 μm, and more preferably from 0.05 to 5 μm.

The content ratio by weight of the hydrophilic layer resin or the self film-forming particles to the inorganic particles is preferably (2–50):(10–50), in unevenness of the hydrophilic layer surface providing a hydrophilic layer having excellent mechanical strength, water retention and image durability (hereinafter also referred to as image printing durability).

The hydrophilic layer in the invention may have a cross-linked structure in order to further increase its mechanical strength. As a cross-linking agent, formaldehyde, an epoxy resin, a melamine resin, glyoxal, polyisocyanate, and hydrolyzable tetraalkylorthosilicate can be used. The content of the cross-linking agent in the hydrophilic layer is from more than 0 to 1% by weight. The coating amount of the hydrophilic layer is preferably from 0.5 to 10 g/m$^2$, and more preferably from 1.0 to 5 g/m$^2$.

As particles of heat-fusible particles contained in a thermosensitive layer provided on the hydrophilic support, there are particles of known thermoplastic resins, synthetic rubbers or waxes.

Examples of the thermoplastic resins include acryl resins, styrene-acryl resins, polyesters, polyurethanes, polyethers, polyethylene, polypropylene, polystyrene, ionomer resins, vinyl acetate resins, and vinyl chloride resins.

Examples of the synthetic rubbers include polybutadiene, polyisoprene, polychloroprene, styrene-butadiene copolymer, an acrylate-butadiene copolymer, a methacrylate-butadiene copolymer, isobutylene-isoprene copolymer, acrylonitrile-butadiene copolymer, acrylonitrile-isoprene copolymer, and styrene-isoprene copolymer.

Of the thermoplastic resins or synthetic rubbers described above, those having a melting point or softening point of not less than 60° C. and having a contact angle to water of not less than 50 degrees are advantageous in view of S/N ratio in image or sensitivity. Herein, the contact angle is that of a sheet of the thermoplastic resins or synthetic rubbers to water.

Examples of the waxes used include natural waxes such as carnauba wax, bees wax, spermaceti wax, Japan wax, jojoba oil, lanolin, ozocerite, paraffin wax, montan wax, candelilla wax, ceresine wax, microcrystalline wax and rice wax; polyethylene wax; Fischer-Tropsh wax; montan wax derivatives; paraffin wax derivatives; microcrystalline wax derivatives; and higher fatty acids. Of these, those having a melting point of from 50 to 150° C., and a melt viscosity at 140° C. of not more than 0.02 Pa/s are preferred in view of S/N ratio in image or sensitivity. Further, those having a penetration defined in JIS K2530-1966 of not more than 1 are preferred in view of printing durability.

Carnauba wax, candelilla wax, and FT wax are preferable as heat-fusible materials satisfying the physical properties described above.

Further, the average particle diameter of particles of the thermoplastic or heat-fusible materials contained in the image formation layer is preferably 0.1 to 0.5 μm. The physical properties described above are important to provide high printing durability. The content of the particles of the thermoplastic or heat-fusible materials in the image formation layer is preferably from 40 to 100% by weight.

The hydrophobic precursors used in the invention may be any as long as an affinity to printing ink is produced by heat application, and there is, for example, a polymer having an aryldiazosulfonate group, and typically, the polymer is one containing in the molecule a monomer unit represented by the following formula.

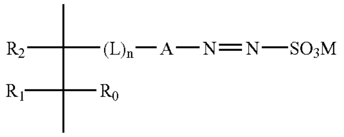

In formula above, $R_0$, $R_1$ and $R_2$ independently represent a hydrogen atom, an alkyl group, a nitrile group or a halogen atom; L represents a divalent linkage group; n represents 0 or 1; A represents an arylene group; and M represents a cationic group.

L represents —(X)t-CONR$_3$—, —(X)t-COO—, —X—, or —(X)t—CO—, in which t represents 0 or 1; $R_3$ represents a hydrogen atom, an alkyl group or an aryl group; and X represents an alkylene group, an arylene group, an alkyleneoxy group, an aryleneoxy group, an alkylenethio group, an arylenethio group, an alkyleneamino group, an aryleneamino group, oxygen, sulfur, or an imino group.

A is preferably an unsubstituted arylene group (for example, an unsubstituted phenylene group), or an arylene group (for example, a phenylene group) having a substituent such as an alkyl group, an aryl group, an alkoxy group, an aryloxy group, or an amino group.

Examples of M include a cation, for example, $NH_4^+$, and a metal ion, for example, a cation of a metal such as Al, Cu, Zn, an alkaline earth metal or an alkali metal.

The polymer having an aryldiazosulfonate group is preferably prepared by polymerization of the corresponding monomer having an aryldiazosulfonate group. The monomer having an aryldiazosulfonate group is disclosed in EP-A-339,393 and EP-A-507,008. Preferred examples of the monomer will be listed below.

M1

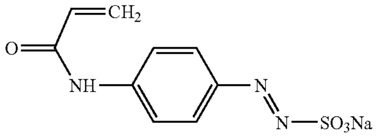

M2

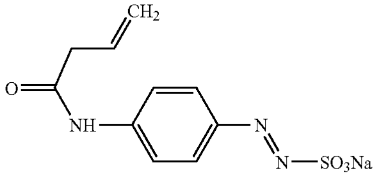

-continued

M3

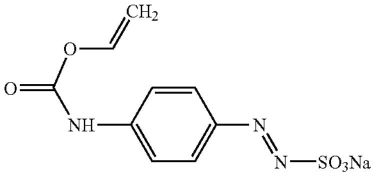

M4

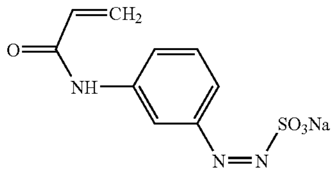

M5

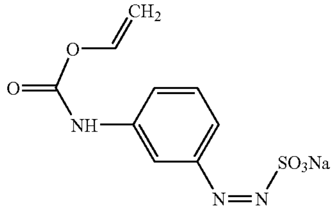

M6

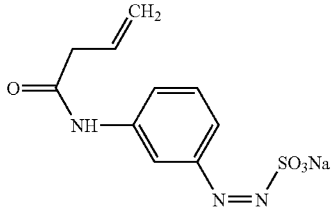

M7

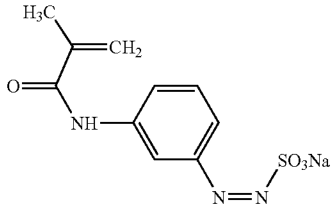

M8

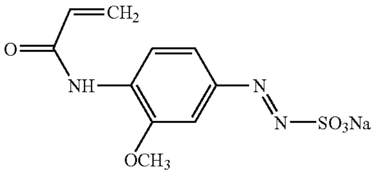

M9

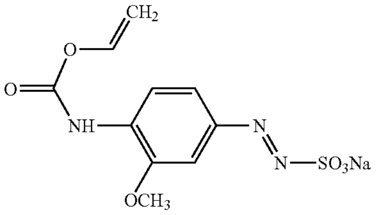

-continued

M10

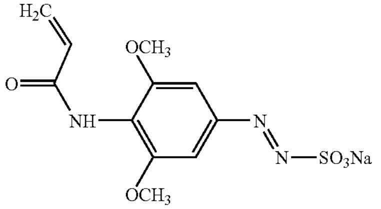

M11

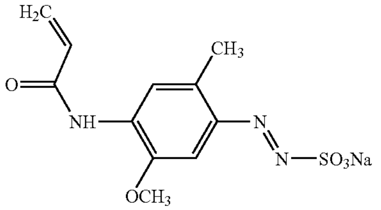

M12

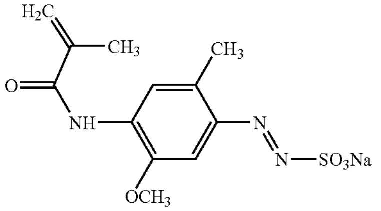

M13

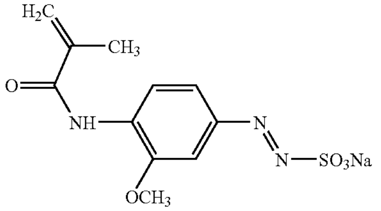

M14

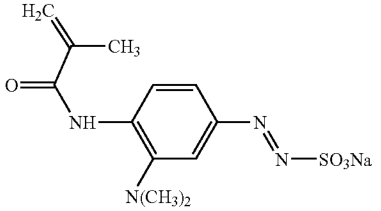

M15

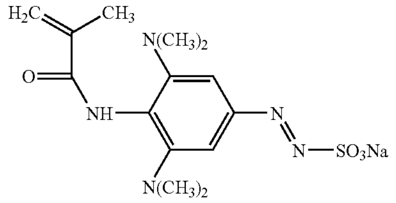

M16

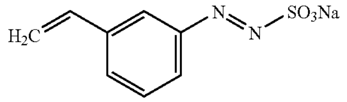

M17

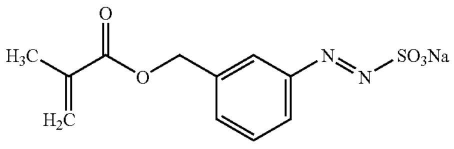

-continued

M18

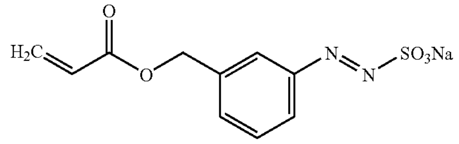

M19

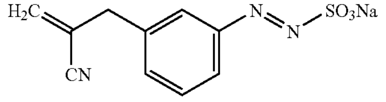

The polymer having an aryldiazosulfonate group may be a polymer obtained by homopolymerization of a monomer having an aryldiazosulfonate group or a copolymer obtained by copolymerization of a monomer having an aryldiazosulfonate group with a monomer having another aryldiazosulfonate group or another monomer such as (meth)acrylic acid or its esters, (meth)acrylamide, acrylonitrile, vinyl acetate, vinyl chloride, vinylidene chloride, styrene, or α-methylstyrene. The copolymer should be prepared so that it does not lose a water soluble property. The content of the monomer unit having an aryldiazosulfonate group in the polymer having an aryldiazosulfonate group is preferably from 10 to 60 mol %.

As microcapsules used in the invention, there are microcapsules encapsulating a compound having a heat-reactive functional group. Examples of the heat-reactive functional group include a polymerizable unsaturated group, an isocyanate group, an epoxy group, a hydroxy group, a carboxyl group, a methylol group, an amino group, and a diazosulfonate group. An isocyanate group or a diazosulfonate group is preferred in view of sensitivity for practical use.

Examples of the compound having an isocyanate group include 2,4-tolylenediisocyanate, 2,6-tolylenediisocyanate, 4,4'-diphenylmethane diisocyanate, 1,5-naphthalene diisocyanate, tolidinediisocyanate, 1,6-hexamethylenediisocyanate, isophoronediisocyanate, xylylenediisocyanate, lysinediisocyanate, triphenylmethanetriisocyanate, and bicycloheptanediisocyanate.

As the compound having a diazosulfonate group, the hydrophobic precursors described above can be used.

As a method of preparing microcapsules encapsulating the compound having a heat reactive functional group or the hydrophobic precursors described above, known methods can be used, which include a coacervation method disclosed in U.S. Pat. Nos. 2,800,457 and 2,800,458; an interfacial polymerization method disclosed in British Patent No. 990, 443, U.S. Pat. No. 3,287,154, and Japanese Patent Publication Nos. 38-19574, 42-446, and 42-711; a polymer precipitation method disclosed in U.S. Pat. Nos. 3,418,250 and 23,660,304; a method employing isocyanatepolyol as a wall material disclosed in U.S. Pat. No. 3,796,669; a method employing isocyanate as a wall material disclosed in U.S. Pat. No. 3,914,511; a method employing urea-formaldehyde resin or urea-formaldehyde-resorcinol resin as a wall material disclosed in U.S. Pat. Nos. 4,001,140, 4,087,376 and 4,089,802; a method employing melamine-formaldehyde resin or hydroxycellulose as a wall material disclosed in U.S. Pat. No. 40,254,450; an in-situ method employing polymerization of a monomer disclosed in Japanese Patent Publication Nos. 36-9163 and 51-9079; a spray drying method disclosed in British Patent No. 930,422 and U.S. Pat. No. 3,111,407; and an electrolytic dispersing and cooling method disclosed in British Patent Nos. 952807 and 967074. However, the invention is not specifically limited thereto.

The image formation layer in the invention may contain a water soluble resin as an agent for preventing adhesion between the heat-fusible particles during storage. Examples of the water soluble resin include conventional water soluble polymers, for example, a synthetic homopolymer or copolymer such as polyvinyl alcohol, poly(meth)acrylic acid, poly (meth)acrylamide, polyhydroxyethyl(meth)acrylate or polyvinyl methyl ether, and a natural binder such as gelatin, polysaccharides, for example, dextrane, pullulan, cellulose, gum arabic, alginic acid, polyethylene glycol, or polyethylene oxide. The water soluble polymer content of the image forming layer in the invention is preferably 0 to 50% by weight. The coating amount of the image formation layer in the invention is preferably in the range of from 0.1 to 1.0 $g/m^2$ of layer. The image formation layer having a coating amount of the layer falling outside the above range is difficult to obtain high printing durability.

When in the invention an image is formed employing light to heat conversion due to laser, the image formation layer or hydrophilic layer in the invention preferably contains a light-to-heat conversion material.

As a light-to-heat conversion, a light-to-heat conversion having absorption in the near-infrared wavelength region is preferably used. Examples of the light-to-heat conversion material include an inorganic compound such as carbon black; an organic compound such as a cyanine dye, a polymethine dye, an azulenium dye, a squalenium dye, a thiopyrylium dye, a naphthoquinone dye or an anthraquinone dye; an organic metal complex of phthalocyanine, azo or thioamide type; a metal such as Co, Cr, Fe, Mn, Ni, Cu, or Ti; and an oxide, nitride or nitrogen oxide of the metal.

Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds can be used singly or in combination of two or more kinds thereof.

The content of the light-to-heat conversion material in the hydrophilic layer or image formation layer is preferably from 3 to 20% by weight.

As other embodiments of a planographic printing plate material used in the invention, there are the following ones:

(Planographic Printing Plate Material [2] Comprising two Layers Having a Different Ink Affinity).

In this-type planographic printing plate material, the outermost layer is destroyed by ablation on light exposure and the destroyed layer (which is unnecessary for printing) is removed by printing ink supplied in printing, whereby a layer under the outermost layer, which has ink affinity different from that of the outermost layer, is revealed. This type planographic printing plate material is thus developed.

The two layers having a different ink affinity are two layers provided on a support as follows:

(a) an ink affinity layer and an ink repellent layer in that order provided on a support (b) an ink affinity layer and a hydrophilic layer in that order provided on a support (c) a hydrophilic layer and an ink affinity layer in that order provided on a support The ink affinity layer may be any as long as it can accept printing ink. Examples of the ink affinity layer include a layer prepared by exposing and hardening the photosensitive polymer as disclosed in Japanese Patent O.P.I. Publication No. 60-22903, a layer prepared by heat hardening epoxy resins as disclosed in Japanese Patent O.P.I. Publication No. 62050760, a layer prepared by hardening a gelatin layer as disclosed in Japanese Patent O.P.I. Publication No. 63-133151, a layer prepared by employing urethane resin and a silane coupling agent as disclosed in Japanese Patent O.P.I. Publication No. 3-200965, and a layer prepared by employing urethane resin as disclosed in Japanese Patent O.P.I. Publication No. 3-273248; Besides the above, a layer prepared by hardening a gelatin or casein layer is also useful.

The dry thickness of the ink affinity layer is suitably from 0.1 to 10 $g/m^2$, preferably from 0.2 to 8 $g/m^2$, and more preferably from 0.5 to 5 $g/m^2$.

The support itself is also usable as long as it has ink affinity.

As the ink repellent layer, there is a layer containing silicone rubber as a main component disclosed in Japanese Patent O.P.I. Publication No. 2001-26184. The ink repellent layer is preferably formed by curing a condensation type silicone employing a crosslinking agent or by addition polymerizing an addition type silicone employing a catalyst. As the condensation type silicone is preferably used a composition containing a condensation crosslinking agent (b) in an amount of from 3 to 70 parts by weight, and a catalyst (c) in an amount of from 0.01 to 40 parts by weight, based on 100 parts by weight of a diorganopolysiloxane (a).

The diorganopolysiloxane (a) is a polymer containing the following formula:

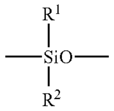

wherein $R^1$ and $R^2$ independently represent an alkyl group having a carbon atom number of from 1 to from 1 to 10, a vinyl group or an aryl group, each of which may have a substituent. It is preferred that not less than 60% of $R^1$ and/or $R^2$ is a methyl group, a halogenated vinyl group or a halogenated phenyl group.

As such a diorganopolysiloxane is preferred one having a hydroxyl group at both molecular terminals. The component (a) has a number average molecular weight of preferably from 3,000 to 100,000, and more preferably from 5,000 to 70,000. The component (b) as a crosslinking agent may be any as long as it is a condensation type one, but is preferably a compound represented by the following formula:

$R^1m—Si—Xn$ wherein $R^1$ is the same as $R^1$ denoted above; X represents a halogen atom such as Cl, Br, or I, a hydrogen atom, a hydroxyl group, or $—OCOR^3$, $—OR^3$, $—ON{=}C(R^4)(R^5)$ or $—N(R^4)(R^5)$, in which $R^3$ represents an alkyl group having a carbon atom number of from 1 to 10 or an aryl group having a carbon atom number of from 6 to 20, and $R^4$ and $R^5$ independently represent an alkyl group having a carbon atom number of from 1 to 10; n is an integer of not less than 2; and m+n is 4.

As the component (c), there are a salt of carboxylic acid and a metal such as tin, zinc, lead, calcium or manganese, or known catalysts such as butyl laurate, lead octylate, lead naphthenate, and chloroplatinic acid.

As an addition type silicone is preferably used a composition containing an organohydrogenpolysiloxane (e) in an amount of from 0.1 to 25 parts by weight, and an addition catalyst (f) in an amount of from 0.0001 to 1 parts by weight, based on 100 parts by weight of a diorganopolysiloxane (d) with an addition-reacting functional group.

The diorganopolysiloxane (d) with an addition-reacting functional group is an organopolysiloxane having two or more alkenyl (preferably vinyl) groups which directly combine with the silicon atom in the molecule. The alkenyl groups may be positioned in the middle or terminals in the molecular chain. The diorganopolysiloxane (d) may have an alkyl group having a carbon atom number of from 1 to 10 or an aryl group, or a slight amount of a hydroxy-group. The number average molecular weight of the component (d) is preferably from 3,000 to 100,000, and more preferably from 5,000 to 70,000.

As the component (e), there are polydimethylsiloxane having a hydrogen atom at both terminals, $\alpha,\omega$-dimethylpolysiloxane, methylsiloxane with a methyl group at both terminals-dimethylsiloxane copolymer, cyclic polymethylsiloxane, polymethylsiloxane with a trimethylsilyl group at both terminals, and methylsiloxane with a trimethylsilyl group at both terminals-methylsiloxane copolymer.

As the component (f), there are known polymerization catalysts. Typical examples thereof include a platinum compound, platinum, platinum chloride, chloroplatinic acid, and an olefin-platinum complex.

In order to control curing speed of the silicone rubber layer, these compositions can contain a vinyl group-containing organopolysiloxane such as tetracyclo(methylvinyl)siloxane, alcohol having a carbon-carbon triple bond, or an anti-crosslinking agent such as acetone, methyl ethyl ketone, methanol, ethanol, or propylene glycol monomethyl ether. The silicone rubber layer optionally contains inorganic particles such as particles of silica, calcium carbonate or titanium oxide; an adhesive auxiliary such as a silane coupling agent, a titanium-containing coupling agent or an aluminum-containing coupling agent; or a photopolymerization initiator.

The dry thickness of the ink repellent silicone rubber layer is preferably from 0.5 to 5 $g/m^2$, and more preferably from 1 to 3 $g/m^2$.

As the hydrophilic layer, the same hydrophilic layer as described in the planographic printing plate material [1] above can be used.

In this structure, the ink repellent layer, hydrophilic layer and/or the ink affinity layer can contain the light-to-heat conversion material described above, in that an image is easily formed by ablation due to irradiation of laser. The light-to-heat conversion material content of each layer is preferably from 5 to 50% by weight. An ablation layer may be provided between the two layers described above.

The ablation layer is a layer containing the light-to-heat conversion material above and a binder. Examples of the binder include cellulose derivatives such as cellulose, nitrocellulose, and ethyl cellulose; a homopolymer or copolymer of acrylates, a homopolymer or copolymer of methacrylates such as methyl methacrylate or butyl methacrylate; acrylate-methacrylate copolymers; a homopolymer or copolymer of styrene such as styrene or $\alpha$-methylstyrene; synthetic rubbers such as polyisoprene or styrene-butadiene copolymer; polyvinyl esters such as polyvinyl acetate; copolymers of vinylesters such as a vinyl acetate-vinyl chloride copolymer; polycondensation polymer such as polyurea, polyurethane, polyesters and polycarbonates; and binders (used in the so-called "chemical amplification type") disclosed in Frechet et al., J. Imaging Sci., 30(2), 59–64 (1986), "Polymers in Electronics (Symposium Series, P11, 242, T. Davidson, Ed., ACS Washington D.C. (1984) (Ito, Willson))" and E. Reichmanis, and L. F. Thompson, Microelectronic Engineering, 13, pp. 3–10 (1991).

The content ratio by weight of light-to-heat conversion material to the binder in the ablation layer is 10:90 to 70:30. The ablation layer can contain various cross-linking agents in order to increase its mechanical strength and its adhesion to another layer adjacent thereto. As the cross-linking agents, formaldehyde, an epoxy resin, a melamine resin, glyoxal, polyisocyanate, and hydrolyzable tetraalkylorthosilicate can be used.

Another embodiment of the ablation layer is a layer formed by vacuum deposition or sputtering of metal-contained particles capable of converting light to heat. The metal-contained particles include particles of a metal such as aluminum, titanium, tellurium, chromium, tin, indium, bismuth, zinc, lead, or their alloy, and particles of metal oxides, metal carbides, metal nitrides, metal borides, or metal fluorides. The vacuum deposition or sputtering method can form a thin layer. The thickness of the ablation layer formed according to the vacuum deposition or sputtering method is preferably from 50 to 1000 nm, and more preferably from 100 to 800 nm.

<Manufacturing Method of Planographic Printing Plate>

A manufacturing method of the planographic printing plate of the invention will be explained below.

The planographic printing plate material [1] or [2] is imagewise exposed to laser. The emission wavelength of the laser is appropriately selected according to absorption property of the light-to-heat conversion material used. A laser emitting light having a wavelength in the near infrared regions is preferred is suitable for heat mode recording. As a light source, laser is preferred in obtaining high resolution. As laser, a semiconductor laser or a semiconductor excitation solid laser (for example, YAG laser) is preferably used.

The exposed planographic printing plate material is mounted on a plate cylinder of a printing press. (In recent years, when a directly imaging printing press available on the market is employed, the planographic printing plate material is mounted on the plate cylinder, and then imagewise exposed to laser.

While the cylinder is rotated, printing ink is supplied to the exposed planographic printing plate material through an ink roller while the cylinder is rotated, or a dampening solution is supplied to the exposed planographic printing plate material having a hydrophilic layer through a dampening roller. The exposed planographic printing plate material is developed with the supplied printing ink where a layer at portions unnecessary for printing is removed. After that, recording paper sheet being fed, a printing process is carried out.

EXAMPLES

The present invention will be explained below employing examples, but is not limited thereto. In the examples, "parts" is parts by weight, unless otherwise specified.

Example 1

<Manufacture of Varnish for Printing Ink>

The following varnish composition was placed in a four-neck flask with a condenser, a thermometer, and a stirrer, heated to a temperature of 200° C., and stirred for one hour at 200° C. to obtain a solution. Thereafter, 1 part of tolylene diisocyanate (TDI) was added to the resulting solution, and further stirred at 90° C. for 3 hours under nitrogen atmosphere. Thus, varnish 1 and 2 were manufactured.

| | | |
|---|---|---|
| (Varnish 1 composition) | | |
| Rosin-modified phenol resin (Mw: 100,000, Acid value: 15, produced by HITACHI KASEI POLYMER CO., LTD.) | 400 | parts |
| Mineral oil | 59 | parts |
| (Varnish 2 composition) | | |
| Rosin-modified phenol resin (Mw: 100,000, Acid value: 15, produced by HITACHI KASEI POLYMER CO., LTD.) | 400 | parts |
| Linseed oil | 59 | parts |

<Manufacture of Printing Ink 1>

Compound 1 shown below as a polymerizable monomer, α-aminoacetophenone (produced by CIBA SPECIALTY CHEMICALS CO., LTD.) as a photopolymerization initiator, t-butyl-hydroxytoluene (produced by ALBEMARLE CORPORATION) as a polymerization inhibitor, and pigment (Phthalocyanine Blue, produced by DAINICHI SEIKA KOGYO CO., LTD.) were added to the varnish 1 above in an amount as shown in printing ink 1 composition below, kneaded with a three roll kneader, and one part of oxidation polymerization catalyst (mixture of cobalt octylate and manganese octylate, produced by Sintfine CO., LTD.) was added thereto, and stirred for 1 hour. Thus, printing ink 1 was obtained, which contained the polymerizable monomer.

Compound 1

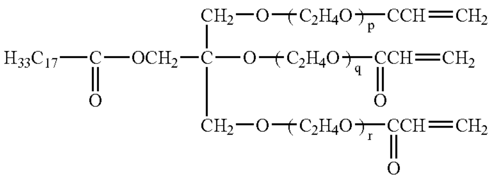

Molecular weight (weight average): 669

| (Printing ink 1 composition) | | |
|---|---|---|
| Pigment Phthalocyanine Blue (produced by DAINICHI SEIKA KOGYO CO., LTD.) | 20.0 | parts |
| Varnish 1 | 43.5 | parts |
| Polymerizable monomer, Compound 1 | 30.0 | parts |
| Photopolymerization initiator α-aminoacetophenone (produced by CIBA SPECIALTY CHEMICALS CO., LTD.) | 5.0 | parts |
| Polymerization inhibitor t-butylhydroxytoluene (produced by ALBEMARLE CORPORATION) | 0.5 | parts |

<Manufacture of Printing Ink 2>

Compound 1 as a polymerizable monomer, α-aminoacetophenone (produced by CIBA SPECIALTY CHEMICALS CO., LTD.) as a photopolymerization initiator, t-butyl-hydroxytoluene (produced by ALBEMARLE CORPORATION) as a polymerization inhibitor, and pigment (Phthalocyanine Blue, produced by DAINICHI SEIKA KOGYO CO., LTD.) were added to the varnish 2 above in an amount as shown in printing ink 2 composition below, kneaded with a three roll kneader, and one part of oxidation polymerization catalyst (mixture of cobalt octylate and manganese octylate, produced by SHINTO FINE CO., LTD.) was added thereto, and stirred for 1 hour. Thus, printing ink 2 was obtained, which contained the polymerizable monomer and vegetable oil.

| (Printing ink 2 composition) | | |
|---|---|---|
| Pigment Phthalocyanine Blue (produced by DAINICHI SEIKA KOGYO CO., LTD.) | 20.0 | parts |
| Varnish 2 | 43.5 | parts |
| Polymerizable monomer, Compound 1 | 30.0 | parts |
| Photopolymerization initiator α-aminoacetophenone (produced by CIBA SPECIALTY CHEMICALS CO., LTD.) | 5.0 | parts |
| Photopolymerization inhibitor t-butylhydroxytoluene (produced by ALBEMARLE CORPORATION) | 0.5 | parts |

<Manufacture of Printing Ink 3>

Pigment (Phthalocyanine Blue, produced by DAINICHI SEIKA KOGYO CO., LTD.) was added to the varnish 1 above in an amount as shown in printing ink 3 composition below and kneaded with a three roll kneader, and four parts by weight of polyethylene wax compound (Wax Compound, produced by SHAMROCK CO., LTD.), one part by weight of dryer, and five parts by weight of mineral oil were further added thereto, and stirred for 1 hour. Thus, printing ink 3 was obtained, which did not contain any of a polymerizable monomer, a polymerizable oligomer and vegetable oil.

| (Printing ink 3 composition) | | |
|---|---|---|
| Pigment Phthalocyanine Blue (produced by DAINICHI SEIKA KOGYO CO., LTD.) | 20.0 | parts |
| Varnish 1 | 70.0 | parts |

(Preparation of Planographic Printing Plate Material Sample 1)

The following subbing layer coating solution was coated on a 188 μm thick PET film to obtain a subbing layer with a dry thickness of 5 μm, and dried at 100° C. for 3 minutes.

| (Subbing layer coating solution) | | |
|---|---|---|
| Linear polyester resin Vylon-200 (produced by TOYO BOSEKI CO., LTD.) | 9.0 | parts |
| Isocyanate hardening agent Colonate L (solid content: 75%, produced by NIPPON URETHANE KOGYO CO., LTD.) | 0.6 | parts |
| Methyl ethyl ketone | 90.4 | parts |

Subsequently, the following anchor layer coating solution, which was obtained by dispersing the components for 30 minutes in a bead mill, coated on the resulting subbing layer through a wire bar to obtain an anchor layer with a coating amount of 2 g/m$^2$, and dried at 100° C. for 1 minute.

| (Anchor layer coating solution) | | |
|---|---|---|
| Colloidal silica (Snowtex XS, solid 20% by weight, produced by Nissan Kagaku Kogyo Co., Ltd.) | 76.94 | parts |
| Colloidal silica (Snowtex ZL, solid 40% by weight, | 2.50 | parts |

-continued

| (Anchor layer coating solution) | |
|---|---|
| produced by Nissan Kagaku Kogyo Co., Ltd.) | |
| Aqueous dispersion of Fe—Mn—Cu composite metal oxide (MF Black 4500, solid content: 40%, produced by Dainichi Seika Kogyo Co., Ltd.) | 2.50 parts |
| Silica particles (Silton JC 40, average particle diameter of 4.0 μm, produced by Mizusawa Kagaku Kogyo Co., Ltd.) | 2.22 parts |
| Montmorillonite (Mineral Colloid MO produced by WILBUR ELLIS Co., Ltd.) | 0.22 parts |
| Aqueous 4% by weight sodium carboxymethyl cellulose solution (produced by Kanto Kagaku Co., Ltd.) | 0.11 parts |
| Sodium phosphate (produced by Kanto Kagaku Co., Ltd.) | 0.06 parts |
| Pure water | 15.45 parts |

A hydrophilic layer coating liquid, which was obtained by dispersing the following hydrophilic layer coating composition in a bead mill for 30 minutes, was coated on the resulting anchor layer to give a coating amount of 1 $g/m^2$ and dried at 100° C. for 1 minute.

| (Hydrophilic layer coating composition) | |
|---|---|
| Colloidal silica (Snowtex S, solid 30% by weight, produced by Nissan Kagaku Kogyo Co., Ltd.) | 10.40 parts |
| Colloidal silica (Snowtex PS-M, solid 20% by weight, produced by Nissan Kagaku Kogyo Co., Ltd.) | 23.40 parts |
| Aluminosilicate particles (AMT Silica 08, average particle diameter of 0.6 μm, produced by Mizusawa Kagaku Kogyo Co., Ltd. | 1.50 parts |
| Silica particles (Silton JC 20, average particle diameter of 2.0 μm, produced by Mizusawa Kagaku Kogyo Co., Ltd.) | 1.20 parts |
| Aqueous 4% by weight sodium carboxymethyl cellulose solution (produced by Kanto Kagaku Co., Ltd.) | 0.12 parts |
| Aqueous dispersion of Fe—Mn—Cu composite metal oxide (MF Black 4500, solid content: 40%, produced by Dainichi Seika Kogyo Co., Ltd.) | 2.70 parts |
| Montmorillonite (Mineral Colloid MO produced by WILBUR ELLIS Co., Ltd.) | 0.24 parts |
| Sodium phosphate (produced by Kanto Kagaku Co., Ltd.) | 0.06 parts |
| Pure water | 19.17 parts |

The coated hydrophilic layer was further subjected to aging treatment at 60° C. for 24 hours, and then the following image formation layer coating solution was coated on the resulting hydrophilic layer to give an image formation layer with a dry thickness of 0.5 $g/m^2$, and dried at 70° C. for 1 minute.

| <Image formation layer coating solution> | |
|---|---|
| Carnauba wax aqueous dispersion (Hi-Disperser A118, solid content: 40% by weight, produced by Gifu Shellac Co., Ltd.) | 9.84 parts |
| Amide wax particle aqueous dispersion (High Micron micron L271, solid content: 25%, produced by Chukyo Yushi Co., Ltd.) | 1.91 parts |
| Trehalose (Treha produced by Hayashihara Shoji Co., Ltd.) | 1.89 parts |
| Pure water | 86.36 parts |

The resulting material was further subjected to aging at 50° C. for 24 hours. Thus, a planographic printing plate material sample 1 was prepared, which had an image formation layer containing heat fusible particles provided on the hydrophilic support.

<Preparation of Planographic Printing Plate Material Sample 2<

A 0.24 mm thick aluminum plate (material 1050, refining H16) was immersed in an aqueous 5% by weight sodium hydroxide solution at 65° C. for 1 minute for degreasing treatment, and washed with water. Subsequently, the aluminum plate was subjected to an electrolytic surface-roughening treatment in a 1% hydrochloric acid solution at 40° C., at a current of 20 A for 20 seconds (400 A·sec/$dm^2$), employing a carbon electrode, washed with water, and immersed (desmut-treated) in a 2% sodium oxide solution at 60° C. for 60 seconds.

Subsequently, the resulting plate was subjected to anodization treatment according to the following conditions:

| | |
|---|---|
| Current density: | 2 A/$dm^2$ |
| Temperature: | 40° C. |
| Treatment time: | 60 seconds |

The resulting plate was immersed in 80° C. water for 30 seconds, dried at 40° C. to obtain a grained aluminum support.

The surface roughness Ra of the resulting aluminum support was 0.34 μm, measured employing a surface roughness measuring device (RST PLUS produced by WYKO Co., Ltd.).

The following image formation layer coating solution 2 was coated on the aluminum support obtained above, and dried at 40° C. for 2 minutes to prepare a planographic printing plate material sample 2.

| (Image formation layer coating solution 2) | |
|---|---|
| Microcapsule dispersion obtained according to the procedure described below (solid content: 20%, produced by GIFU SHELLAC CO., LTD.) | 19.0 parts |
| Carbon black dispersion (SD9020, solid content: 30%, produced by DAINIPPON INK CO., LTD.) | 3.0 parts |
| Poly(sodium acrylate) (DL522, solid content: 30%, produced by NIPPON SHOKUBAI CO., LTD.) | 1.0 part |
| Pure water | 80.0 parts |

(Preparation of Microcapsules)

In 800 parts by weight of methanol were dissolved 180 parts by weight of copolyrner containing a monomer unit from monomer A described later and a monomer unit from methyl inethacrylate in a ratio by weight of 44:60 and 20 parts by weight of infrared absorbing dye (lightto-heat conversion material) described later. The resulting solution was placed in a laboratory dish and dried at 25° C. under vacuum to obtain a hydrophobic precursor containing a diazosulfonate unit.

Fifty parts by weight of the hydrophobic precursor and 450 parts by weight of glass beads with a diameter of 0.5 mm were mixed in flowing chilled water and stirred to form fine particles. After 1 hour stirring, 5 parts by weight of the following wall formation material solution were separately added to the resulting mixture every 5 minutes until the total amount added of the solution arrived at 50 parts by weight. After additional 1 hour stirring, the resulting mixture was added with pure water and filtered with a colander to remove the glass beads. Thus, a microcapsule dispersion was obtained which contained microcapsules with a particle diameter of 0.8 μm containing a diazosulfonate unit as a thermally reactive functional group. The microcapsule dispersion was diluted with pure water to give a solid content of 20%.

was coated on the resulting ablation layer to obtain a hydrophilic layer with a thickness of 1.0 μm, and dried at 100° C. for 5 minutes.

Monomer A

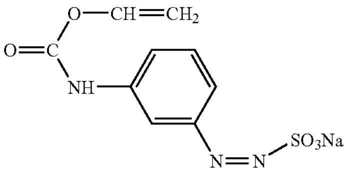

Infrared absorbing dye

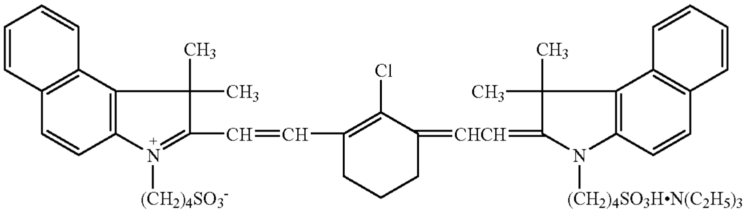

| | |
|---|---|
| (Wall formation material solution) | |
| Aqueous 10% solution of polyvinyl alcohol EG05 (produced by NIPPON GOSEI KAGAKU KOGYO CO., LTD.) | 95.0 parts |
| Melamine resin, Sumirez resin 613 (produced by SUMITOMO KAGAKU CO., LTD.) | 5.0 parts |

(Preparation of Planographic Printing Plate Material Sample 3)

The following subbing layer coating solution was coated on a 200 μm thick PET film and dried at 100° C. for 3 minutes to obtain a subbing layer with a dry thickness of 5 μm.

| (Subbing layer coating solution) | |
|---|---|
| Linear polyester resin Vylon-200 (produced by TOYO BOSEKI CO., LTD.) | 19.0 parts |
| Isocyanate hardening agent Colonate L (solid content: 75%, produced by NIPPON URETHANE KOGYO CO., LTD.) | 1.2 parts |
| Methyl ethyl ketone | 79.8 parts |

Subsequently, the following ablation layer coating solution, which was obtained by dispersing the components for 4 hours in a bead mill, coated on the resulting subbing layer and dried at 100° C. for 3 minutes to obtain an ablation layer with a thickness of 0.15 μm.

| (Ablation layer coating solution) | |
|---|---|
| Carbon black Ma-100 (produced by TOYO BOSEKI CO., LTD.) | 12.0 parts |
| Polyester resin UR-8300 (Solid content: 30%, produced by TOYO BOSEKI CO., LTD.) | 25.0 parts |
| Isocyanate hardening agent Colonate L (solid content: 75%, produced by NIPPON URETHANE KOGYO CO., LTD.) | 1.2 parts |
| Methyl ethyl ketone | 61.8 parts |

Subsequently, the following hydrophilic layer coating solution prepared according to the method described below Thus, a planographic printing plate material sample 3 was prepared, which was capable of forming an image by ablation, and had two layers having a different ink affinity.

(Hydrophilic Layer Coating Solution)

250 parts by weight of an ion-exchange water solution containing 2% of polyvinyl alcohol NL-05 (produced by NIPPON GOSEI KAGAKU KOGYO CO., LTD.) was dropwise added to 450 parts by weight of an ion-exchange water solution containing 20% of $TiO_2$ (with an average particle diameter of 0.3 μm) and 2% of NL-05 to obtain a dispersion. Subsequently, 120 parts by weight of an ion-exchange water solution containing 20% of tetramethyl orthosilicate and 2% of silicon-containing surfactant FZ2161 (produced by NIPPON UNICAR CO., LTD.) were dropwise added to the resulting dispersion with vigorous stirring to the mixture, and after addition, further stirred for 10 minutes. Thus, a hydrophilic layer coating solution was obtained.

<Preparation of Prints>

The resulting planographic printing plate material samples 1, 2 and 3 were imagewise exposed based on image data containing a 50% screen tint with a screen line number of 175 and a face image, employing a 830 nm semiconductor laser (with a beam spot diameter of 10 μm, at a resolution of 2000 dpi in the scanning and sub-scanning directions). Exposure energy on the sample surface was 300 mJ/$cm^2$ in samples 1 and 2, and was 500 mJ/$cm^2$ in sample 3. Herein, "dpi" means a dot number per 2.54 cm.

Each of the above exposed samples 1, 2, and 3 was mounted on a plate cylinder of a DAIYA 1F-1 type printing press. The mounted sample was made to contact a dampening roller and supplied with a dampening solution (a 2% by weight solution of Astromark 3 (produced by Nikken Kagaku Kenkyusyo Co., Ltd.) during two revolutions of the cylinder, and then made to contact an ink roller and supplied with printing ink 1, 2, or 3 shown in Table 1 during two revolutions of the cylinder. Successively, the sample remained in contact with the dampening roller and the ink roller, and printing paper sheets were fed and printing was initiated.

Immediately after printing, the printed matter was exposed to UV light to dry the printing ink. Thus, prints were obtained.

<Evaluation>

(Initial Printability)

The number of paper sheets printed from when printing started to when good prints without ink stains at non-image portions were obtained was determined as a measure of initial printability. The lower the number is, the better.

(Image Faults)

In the fiftieth print after printing started, the number of filling-up per 10 cm×10 cm in the 50% screen tint image was counted as a measure of image faults. The lower the number is, the better.

(Scratch Resistance)

Before printing, the planographic printing plate material sample was scratched with a fingernail to make scratches at portions corresponding to non-image portions. Whether image faults occurred at the scratched portions was observed, and evaluated according to the following criteria:

A: No stains occurred at non-image portions.

B: Slight stains occurred at non-image portions at the initial printing stage, but the stains disappeared before 50 copies were printed.

C: Apparent stains occurred at non-image portions.

(Printing Image Quality)

Differences between the face image quality of the tenth print and that of 10,000$^{th}$ print were evaluated by ten competent people, and were evaluated according to the following criteria:

A: At least nine people confirmed that there were no differences.

B: Five to eight people confirmed that there were no differences.

C: One to four people confirmed that there were no differences.

The results are shown in Table 1.

TABLE 1

| Sample No. | Printing ink used | Initial print-ability | Image faults | Scratch resistance | Printing image quality | Re-marks |
|---|---|---|---|---|---|---|
| 1 | 1 | 0 | 2 | B | A | Inv. |
| | 2 | 0 | 0 | A | A | Inv. |
| | 3 | 5 | 10 | C | C | Comp. |
| 2 | 2 | 0 | 1 | A | B | Inv. |
| | 3 | 7 | 18 | C | C | Comp. |
| 3 | 2 | 1 | 3 | A | A | Inv. |
| | 3 | 15 | 25 | C | B | Comp. |

Inv.: Inventive, Comp.: Comparative

As is apparent from Table 1, the inventive process, employing printing ink a polymerizable monomer or a polymerizable oligomer, provided good initial printability, reduced image faults, good scratch resistance and good printing image quality as compared with a process employing a printing ink without a polymerizable monomer or a polymerizable oligomer. Further, the inventive process, employing printing ink a polymerizable monomer or a polymerizable oligomer and vegetable oil provided better results.

The present invention is a process of manufacturing a planographic printing plate from a planographic printing plate material, the process comprising the steps of imagewise exposing the planographic printing plate material, and developing the exposed planographic printing plate material by supplying, to the exposed planographic printing plate material printing ink containing a polymerizable monomer and/or a polymerizable oligomer, and preferably a polymerizable monomer and/or a polymerizable oligomer and vegetable oil to the exposed planographic printing plate material, the process shortening developing time of the planographic printing plate material mounted on a plate cylinder of a printing, reducing stains at scratched portions and at non-image portions from initial printing stage, and providing prints with good quality image regardless of the number of prints.

What is claimed is:

1. A process of manufacturing a planographic printing plate from a planographic printing plate material comprising a support and provided thereon, at least one of an image formation layer and an ablation layer, the process comprising the steps of:

imagewise exposing the planographic printing plate material; and developing the exposed planographic printing plate material by supplying printing ink containing at least one of a polymerizable monomer and a polymerizable oligomer to the exposed planographic printing plate material, wherein the content of at least one of the polymerizable monomer and the polymerizable oligomer in the printing ink is 10 to less than 40% by weight.

2. The process of claim 1, wherein the at least one of the polymerizable monomer and the polymerizable oligomer is selected from the group consisting of (meth)acrylic acid, maleic acid, and their oligomer; and urethane resin, epoxy resin, polyester resin, polyol resin, rosin resin, and vegetable oil, each being modified with a compound having an ethylenically unsaturated bond.

3. The process of claim 1, wherein the at least one of the polymerizable monomer and the polymerizable oligomer is vegetable oil modified with a compound having an ethylenically unsaturated bond.

4. The process of claim 1, wherein the support is a hydrophilic support.

5. The process of claim 1, wherein the image formation layer contains heat fusible particles, hydrophobic precursor particles or microcapsules.

6. The process of claim 1, wherein the printing ink further-contains vegetable oil.

7. The process of claim 6, wherein the vegetable oil is soybean oil.

8. A printing process comprising the steps of:

supplying printing ink containing a polymerizable monomer or a polymerizable oligomer to a planographic printing plate manufactured according to the process of claim 1 to form an ink image on the printing plate, and transferring the formed ink image onto a recording sheet to obtain a print, wherein the content of at least one of the polymerizable monomer and the polymerizable oligomer in the printing ink is 10 to less than 40% by weight.

* * * * *